(12) United States Patent  
Sirito-Olivier et al.

(10) Patent No.: US 8,195,116 B2  
(45) Date of Patent: Jun. 5, 2012

(54) RECEIVER CIRCUITRY WITH VARIABLE GAIN AMPLIFIER

(75) Inventors: Philippe Sirito-Olivier, Carro Par Martigues (FR); Pietro Calo, Laterza (IT); Mario Chiricosia, Messina (IT)

(73) Assignee: STMicroelectronics S.A., Montrouge (FR)

( * ) Notice: Subject to any disclaimer, the term of this patent is extended or adjusted under 35 U.S.C. 154(b) by 997 days.

(21) Appl. No.: 12/117,997

(22) Filed: May 9, 2008

(65) Prior Publication Data

US 2008/0278240 A1    Nov. 13, 2008

(30) Foreign Application Priority Data

May 11, 2007    (FR) ...................................... 07 54997

(51) Int. Cl.
*H04B 1/06* (2006.01)

(52) U.S. Cl. ...................... 455/234.1; 455/293; 455/341

(58) Field of Classification Search ............... 455/232.1, 455/234.1, 234.2, 280, 293, 334, 338, 341; 341/126, 139, 141, 155, 162
See application file for complete search history.

(56) References Cited

U.S. PATENT DOCUMENTS

| 3,842,413 A * | 10/1974 | Lagarde ........................ 341/163 |
| 5,499,027 A * | 3/1996 | Karanicolas et al. .......... 341/120 |
| 2005/0062635 A1 * | 3/2005 | Franz ............................ 341/161 |

* cited by examiner

*Primary Examiner* — Nguyen Vo

(74) *Attorney, Agent, or Firm* — Wolf, Greenfield & Sacks, P.C.

(57) ABSTRACT

Receiving circuitry having a plurality of amplifiers coupled in series, a first of the amplifiers receiving an input signal and each of the amplifiers outputting an amplified signal; a plurality of comparators each coupled to the output of one of the amplifiers and having an input for receiving the amplified signal; signal identification circuitry coupled to the outputs of the comparators and arranged to determine whether the outputs of the comparators validly represent data; and signal selection circuitry arranged to select the best signal originating from the comparators based on the validity of the outputs of the comparators.

21 Claims, 3 Drawing Sheets

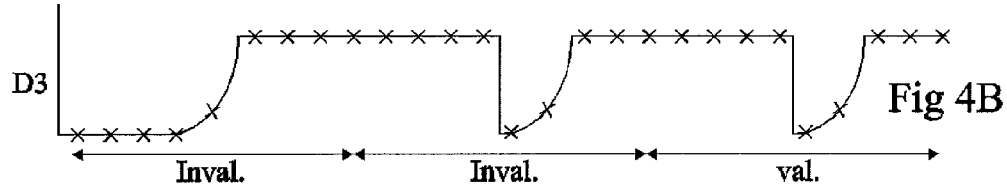
Fig 4A
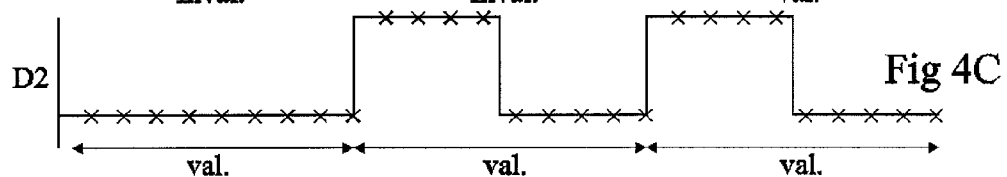
Fig 4B
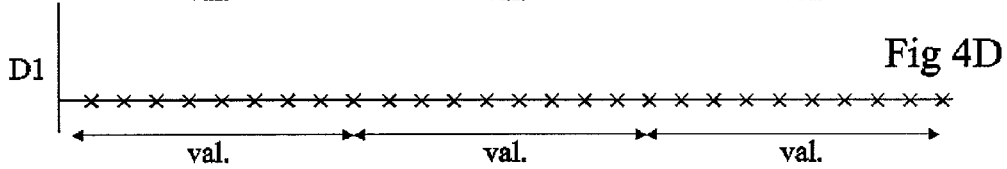
Fig 4C
Fig 4D
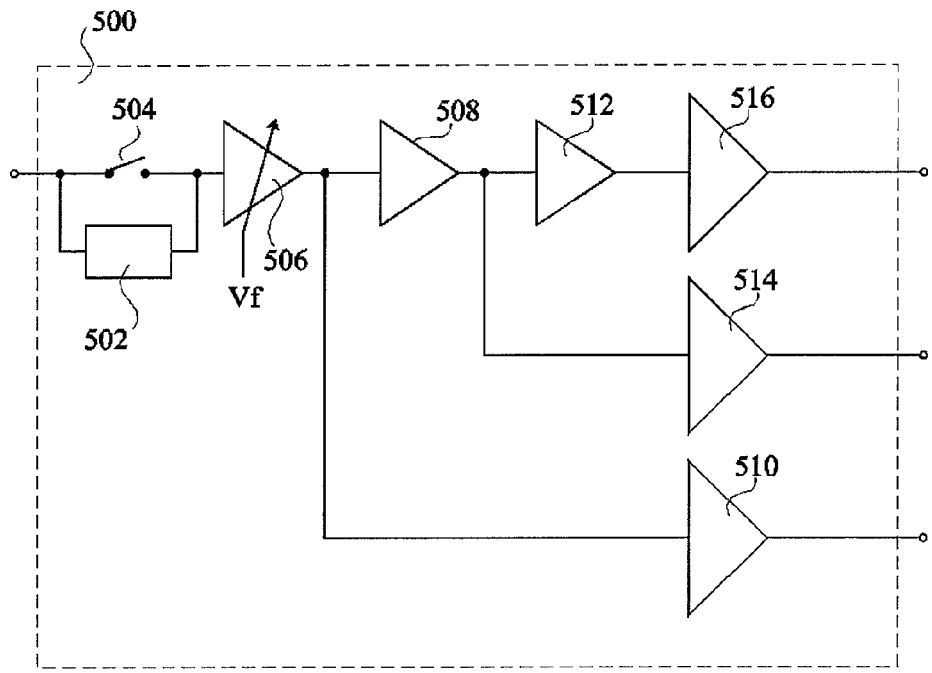
Fig 5

RECEIVER CIRCUITRY WITH VARIABLE GAIN AMPLIFIER

FIELD OF THE INVENTION

The present invention relates to receiver circuitry, and in particular to receiver circuitry in a telecommunication system.

BACKGROUND TO THE INVENTION

In modern data telecommunication systems, the receiver generally comprises an analog input amplifier stage coupled to analog-to-digital converter (ADC), the output of the ADC being provided to a digital signal processor (DSP).

The ADC generally has a limited input range and it is the role of the input amplifier stage to dynamically adjust the voltage of the input signal such that the ADC always receives a signal within its operating voltage. A problem is that the input signal in certain telecommunication systems can vary greatly in amplitude. The amplitude can, for example, depend on the distance between the telecommunication equipment and the transmitter and objects between the equipment and the transmitter, such as buildings etc. For example, in mobile telephone networks, mobile telephones which are closer to a telecommunications mast receive much higher signal strengths than mobile telephones which are very close to the edge of a network cell, very far from the mast. Furthermore, reception can be strong above ground, but weak below ground.

It has been proposed to use a variable gain amplifier (VGA) to dynamically adjust the input voltage to the correct level for the ADC. However, where a wide range of input voltages are possible, such a circuit is difficult to implement. Furthermore, it is slow to respond to input voltage changes, and has high power consumption.

SUMMARY OF THE INVENTION

According to an aspect of the present invention there is provided receiving circuitry comprising: a plurality of amplifiers coupled in series, a first of said amplifiers receiving an input signal and each of said amplifiers outputting an amplified signal; a plurality of comparators each coupled to the output of one of said amplifiers and comprising an input for receiving said amplified signal; signal identification circuitry coupled to the outputs of said comparators and arranged to determine whether the outputs of said comparators validly represent data; and signal selection circuitry arranged to select the best signal originating from said comparators based on the validity of the outputs of said comparators.

According to one embodiment of the present invention, the outputs of the comparators are ranked according to the amplification of the amplified signal at their inputs, the comparator receiving the most amplified signal being given the highest rank, wherein said best signal is determined as the highest ranking valid signal.

According to an embodiment of the present invention, the signal identification circuitry comprises sampling circuitry arranged to sample the outputs of said comparators, and to compare said samples with registered values in order to determine whether said outputs of said comparators represent valid data.

According to an embodiment of the present invention, each of said comparators comprises a low threshold value and a high threshold value, said high threshold value being used to detect when a high output from said comparator is provided, and said low threshold being used to determine when a low output from said comparator is provided.

According to one embodiment of the present invention, the plurality of amplifiers are fixed gain amplifiers, and further comprising a variable gain amplifier connected in series with the fixed gain amplifiers.

According to one embodiment of the present invention, the circuitry further comprises an attenuator selectively coupled to said first of said amplifiers for selectively attenuating said input signal.

According to another aspect of the present invention, there is provided a portable device comprising the receiving circuitry coupled to a processor.

According to another aspect of the present invention, there is provided a method of receiving a data signal comprising: amplifying the data signal by a plurality of different amplification factors to generate a plurality of amplified signals; comparing said plurality of amplified signals with at least one threshold value to generate a plurality of output signals; determining whether each of said plurality of output signals validly represents data; and selecting the best signal of said output signals based on the validity of said output signals.

According to one embodiment of the present invention, the method further comprises determining the best signal as the highest ranking valid output signal from said comparators, wherein said ranking is determined based on the amplification of the amplified signal at the input of each comparator.

According to one embodiment of the present invention, determining whether the output signals represent valid data comprises sampling said output signals and compare said samples with values corresponding to valid data in order to determine whether said outputs of said comparators represent valid data.

BRIEF DESCRIPTION OF THE DRAWINGS

The foregoing and other purposes, features and advantages will become apparent from the following detailed description, given by way of illustration and not limitation with reference to the accompanying drawings.

FIGS. 4A to 4D are timing diagrams illustrating examples of the signals in the circuitry of FIG. 2 according to an embodiment of the present invention; and FIG. 5 illustrates schematically input circuitry of a telecommunication receiver according to a further embodiment of the present invention.

DETAILED DESCRIPTION

Figure 1:
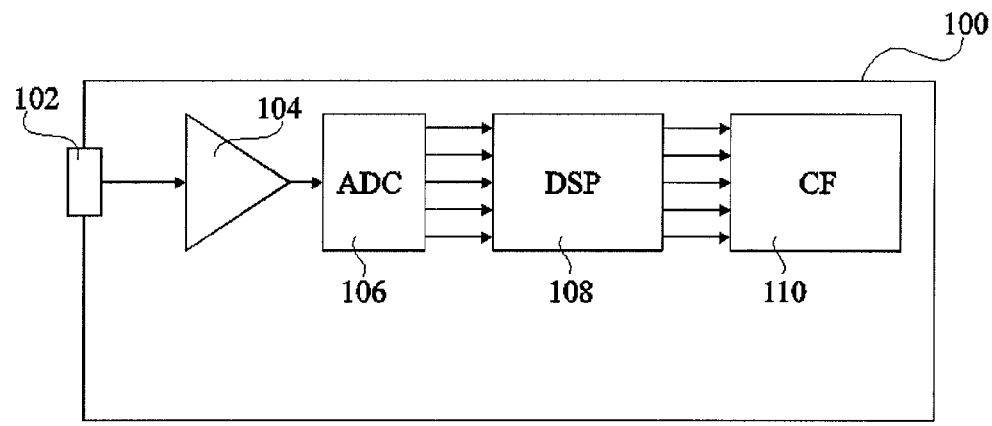
FIG. 1 illustrates schematically a telecommunication receiver according to an embodiment of the present invention.

FIG. 1 illustrates schematically a telecommunication receiver according to one embodiment. Receiver 100 comprises an input node 102, which is, for example, connected to an antenna or alternative sensing system for receiving a signal transmitted by a transmitter. The input node 102 is connected to an amplifier stage 104, which amplifies the signal such that it is within the accepted input range of an ADC 106. ADC 106 receives the signal from amplifier 104, and generates a digital signal on one or more output lines which is provided to a DSP or alternative processing means 108. DSP 108 for example filters the signal or performs other operations on the signal, before providing the signal to a further control function (CF) block 110, which is, for example, a control system arranged to perform actions based on the data bits received.

Amplifier stage 104 is required to respond quickly to changes in the amplitude of receive signal from node 102, such that its output, connected to the ADC 106, is always within a required range, which is, for example, limited to between 0 V and 2 V.

Figure 2:
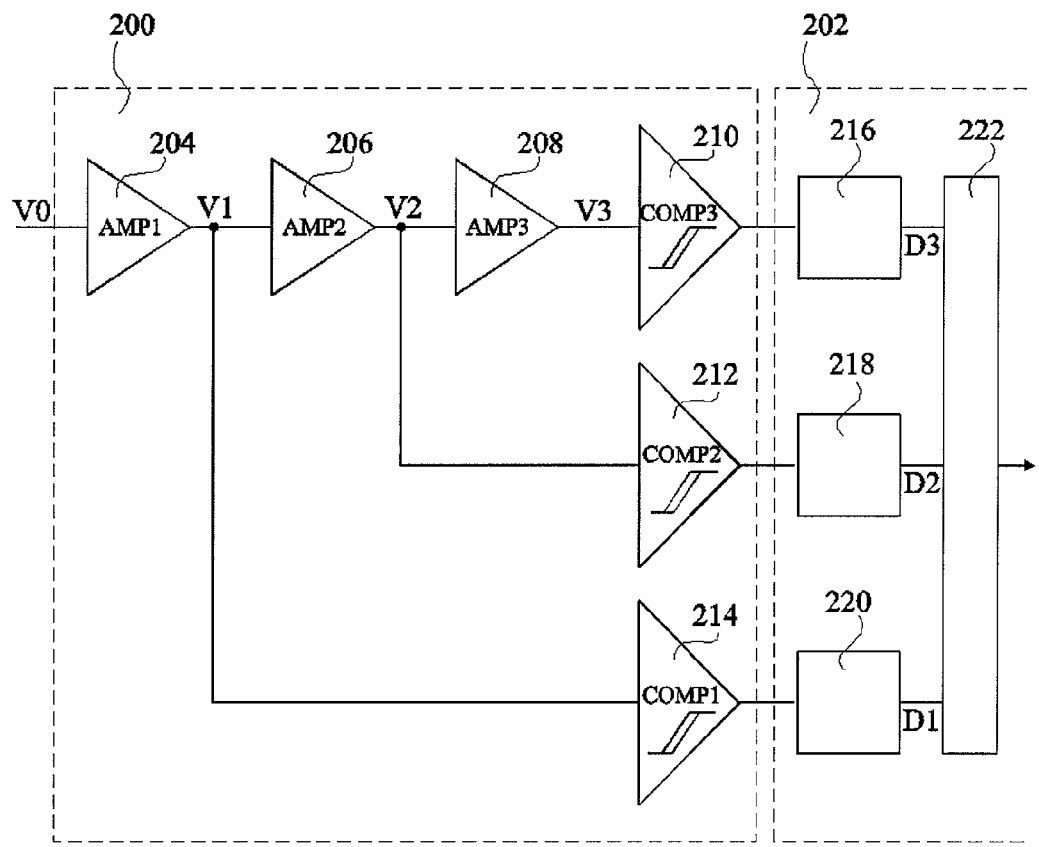
FIG. 2 illustrates schematically input circuitry of a telecommunication receiver according to an embodiment of the present invention.

FIG. 2 illustrates schematically an amplifier stage and ADC block according to one embodiment. In particular, the circuitry comprises an analog block 200 which receives the analog signal at an input node, amplifies the signal and comprises comparators for converting the analog signal to a plurality of digital outputs to a digital block 202. Digital block 202 selects the best of the digital signals provided by the analog block for transmittal to the DSP, and discards the other signals, as will now be described in greater detail below.

Analog block 200 comprises amplifiers 204, 206 and 208 coupled in series. The input of amplifier 204 is connected to an input node (not shown in FIG. 2) of the receiving circuitry. The output of amplifier 208 is coupled to the input terminal of a comparator 210. The output of amplifier 206 is also coupled to the input of a comparator 212. The output from amplifier 204 is also coupled to the input of a comparator 214. Comparators 210, 212 and 214 provide three digital outputs of the analog block 200, which are provided to the digital block 202. These comparators provide the function of an ADC.

Digital block 202 comprises signal identifier circuits 216, 218 and 220, which receive, respectively, the outputs of comparators 210, 212 and 214. The outputs from the signal identifiers 216, 218 and 220 are provided to a signal selection block 222, for example, comprising a multiplexer, which selects the best of these signals to be outputted to a signal processor, for example to DSP 108 shown in FIG. 1.

In operation, amplifier 204 receives an input signal received at the input node of the receiver. Before being provided to the amplifier 204, the signal is for example filtered by a filter (not shown). Amplifiers 204, 206, 208, each amplify the signal by a fixed amount, such that the output of each amplifier has a different amplification factor, equal to the amplification of previous amplifiers, multiplied by the additional amplification they provide. The input to comparator 214 has been amplified by only amplifier 204, and is thus the weakest signal. The input to comparator 212 has been amplified by both amplifiers 204 and 206, and is thus stronger than the input comparator 214. The input to comparator 210 has been amplified by all of the amplifiers 204, 206 and 208, and is therefore the strongest signal.

As an example, assuming amplifier 204 amplifies by 40 dB and amplifiers 206 and 208 by 30 dB, then the outputs from amplifiers 204, 206 and 208 will provide amplifications of the initial input voltage signal V0 of 40 dB, 70 dB and 100 dB respectively.

Depending on the strength of the input signal, the inputs to some of the comparators may not provide a valid signal at the output of the comparator, if for example, the amplitude is not in the required range. For example, if the input signal is very weak, then it may be that only input to comparator 210 is sufficiently strong to provide a valid signal. Alternatively, if the input signal is very strong, then the signals provided to comparators 210 and 212 may have been over-amplified resulting in an invalid signal from these comparators, whereas comparator 214 provides a valid signal. As a further alternative, it may be that an input signal has an amplitude such that the output of amplifier 204 is too weak for comparator 214, while the output of amplifier 208 is too strong for comparator 210, whereas the output of amplifier 206 results in a valid signal from comparator 212.

Signal identifiers 216, 218 and 220 are provided for determining when the outputs from comparators 210 to 214 are valid. In particular, these blocks preferably sample the signals output from respective comparators 210, 212 and 214, and compare the pattern of sampled values with known signal patterns corresponding to valid data. When valid data is detected, a corresponding data signal D1, D2 and D3 is then output from the respective signal identifier block 220, 218 and 216. If there is no valid match between the sampled values and known patterns by one or more signal identifier blocks 216, 218, 220, no data signal is output. Selection block 222, for example, detects a data signal on the data lines from the identifiers and automatically selects the best data signal. Alternatively, the data and a separate valid signal are, for example, output from each signal identifier block 216, 218, 220, and the valid signals are used to directly control the selection block 222. In this case, the signal identifier blocks 216, 218, 220 receive, for example, a synchronization signal generated by a block not shown in the figure. At each timing edge of the synchronization signal, the data signals and valid signal are transmitted.

The signal selector block 222 chooses the best of the output data values D1, D2 and D3. It may be that a very low signal output from one of the comparators 212 or 214 results in a low output from these comparators to respective blocks 218 or 220. Such an output may correspond to a valid signal, which may be caused by insufficient amplification. Alternatively, if D3 is invalid, and D2 valid, then D2 is the correct signal. Thus, the output signals are preferably ranked, and the valid signal having a highest rank is preferably selected as the best signal.

Depending on the way that data is encoded for transmission to the receiver, different types of comparators may be used to sense the input signal and provide a digital output.

Figure 3A:
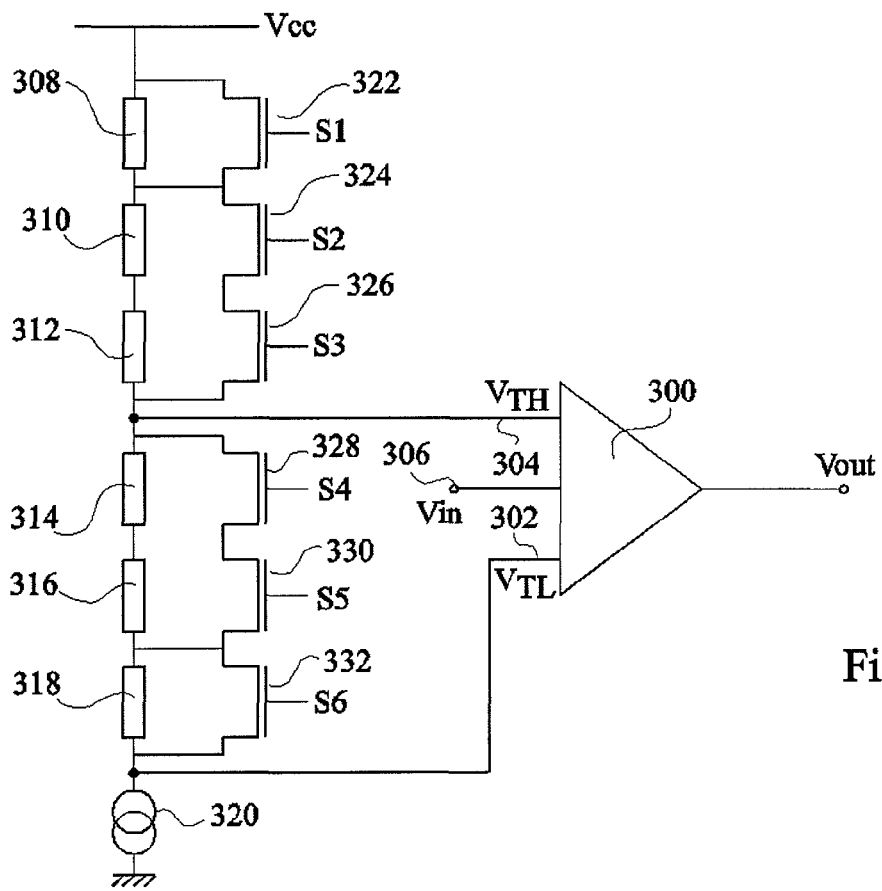
FIG. 3A illustrates in more detail a comparator of FIG. 2 according to an embodiment of the present invention.

FIG. 3 illustrates one example of a comparator 300, for example comparator 210, 212 or 214 of FIG. 2. Comparator 300 comprises a low threshold reference input 302, a high threshold reference input 304, and an input line 306 for receiving the output from the corresponding amplifier stage. The low and high threshold reference values may be fixed values, for example determined by a resistance network. In the example of FIG. 3, a programmable resistance network is provided, such that the low and high threshold values may be adjusted. In particular, a resistor network comprises fixed resistors 308, 310, 312, 314, 316 and 318, connected in series between a supply voltage line Vcc and a current mirror 320, which is connected to ground. Each resistor has a respective transistor 322, 324, 326, 328, 330 or 332 connected across its terminals, such that upon activation of the corresponding transistor by a control signal S1 to S6, the associated resistor may be bypassed. This allows the high threshold on input 304 of the comparator 300 to be controlled between Vcc and Vcc minus the combined voltage across resistors 308, 310 and 312. It also allows the low threshold input 302 of the comparator 300 to be controlled between a value of Vcc minus the combined voltage across resistors 308, 310 and 312, and Vcc minus the voltage across all six resistors 308, 310, 312, 314, 316, 318 of the resistor network. According to some embodiments, this allows the threshold values to be adjusted based on the amplitude of the input signal.

In alternative embodiments, only one threshold value can be provided to the comparator, such that the signal is determined as being high or low based on whether its value is above or below this threshold. However, by providing both high and low threshold values, some hysteresis can be added to the system, which will be explained with reference to FIG. 3B.

Figure 3B:
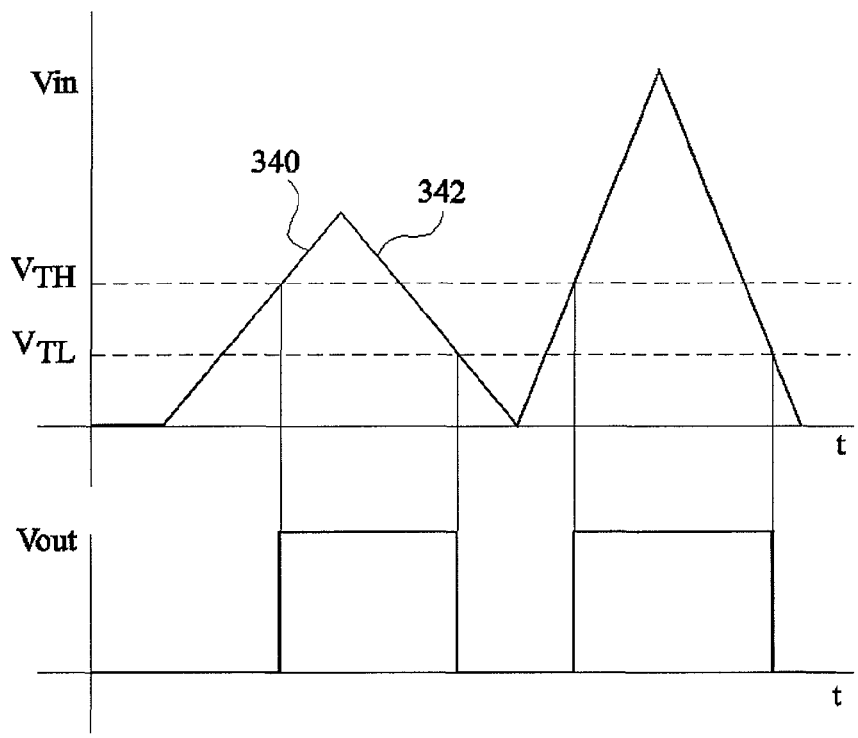
FIG. 3B is a timing diagram illustrating operation of the comparator of FIG. 3A.

FIG. 3B shows two timing diagrams showing examples of the input voltage signal $V_{in}$ and the output signal $V_{out}$ of comparator 300 respectively. As illustrated in FIG. 3B, the higher threshold value is used to determine when a value previously determined as low becomes high. Thus, the input voltage rises in a ramp 340, and when this voltage passes the higher threshold $V_{TH}$, $V_{out}$ goes high. Once $V_{out}$ is high, the low threshold value $V_{TL}$ is used to determine when the value goes low. Thus, as illustrated, the input voltage $V_{in}$ descends in a ramp 342, and when the voltage falls below threshold $V_{TL}$, $V_{out}$ goes low again. This can help to remove noise from the input, or help to avoid oscillation at the output of the comparator if the signal Vin slowly changes.

An example of the operation of the circuitry of FIG. 2 will now be provided with reference to FIGS. 4A to 4D.

FIG. 4A is a timing diagram showing coding of transmitted bits of data according to one example. In this example, a "0" is encoded as a low voltage level, for example 0 V, lasting for a determined duration, and a "1" is encoded as a pulse comprising a high voltage level followed by a low voltage level, the combined duration of the high voltage level and the low voltage level for example having the same duration as the "0" signal. Thus, the signal in FIG. 4A illustrates transmission of three data bits "011" in series.

FIG. 4B illustrates an example of the signal output from comparator 210 resulting from a transmission "011" shown in FIG. 4A. The input to comparator 210 has been amplified by the highest factor. As illustrated, due to over-amplification, this signal at the output of the comparator 310 is distorted and becomes high too early. However, the falling edge of the signal is correctly positioned. In practice, this is often what occurs when there is over-amplification. This signal is then provided to the signal identification block 216, which samples the signal. Examples of the samples taken are shown by crosses in FIG. 4B. During a period of the first bit transmission, rather than a series of low signal values being sampled, due to this distorted signal, five low values and four high values are received. As this combination does not correspond to either 0 bit or 1 bit, this signal is classed as invalid by the signal identification block 216. Likewise, during the period of the transmission of the following 1 bit, due to the distortion of the signal, the low period of the 1 bit is low for only two samples, and is high for remaining three samples. Thus, the "1" cannot be recognized and is classed as invalid. The data output D3 from signal identifier 216 is then invalid for two bits, and "1" for the third bit.

FIG. 4C illustrates an example of the signal output from the second comparator 212. In this example, the output of amplifier 206 provides the correct amount amplification for the input signal, and thus the output of comparator 212 most accurately represents the transmitted signal. In this case, all of the bits are valid. Therefore the data output D2 from signal identifier 218 is "0", "1", "1".

FIG. 4D illustrates an example of the output of comparator 214 in response to the signal of FIG. 4A. In this example, amplification via amplifier 204 is insufficient to bring the signal above the threshold of comparator 214, and thus a series of low values are determined. Given that these values correspond to a "0" bit, the signal D1 is determined as three valid "0" bits received consecutively.

The signal select block 222 for example determines the best output from the signal identification blocks 216, 218 and 220 on a bit-by-bit basis. For the purpose of deciding on the best signal, D3 is preferably given the highest rank, D2 a middle rank, and D1 the lowest rank. When more than one of the outputs of the comparators is valid, the highest ranking signal is used as the output. Thus, for the first bit "0", D3 signal is invalid, and the highest ranking valid bit is provided by D2. The bit is therefore correctly identified as "0". Likewise, the signal corresponding to this second bit is also determined as invalid by D3, and thus the highest ranking valid bit is again provided by D2, and is therefore correctly identified as "1". The third data value at output D3 by signal identification block 216 is valid. D3 is the highest ranking signal and therefore this bit is correctly identified as "1" from D3.

FIG. 5 illustrates schematically analog circuitry 500 which provides an alternative to circuitry 200 of FIG. 2. In this embodiment, an attenuator 502 is provided, connected in parallel to a switch 504, both switch 504 and attenuator 502 being connected to a variable gain amplifier (VGA) 506. VGA 506 is connected to a fixed gain amplifier 508, and to a comparator 510. The output from amplifier 508 is connected to a further fixed gain amplifier 512, and to a comparator 514. The output from fixed gain amplifier 512 is provided to a further comparator 516.

Switch 504 allows the attenuator 502 to be added to the input circuitry in the case that the input signal is so high that the output of amplifier 506 would be too high for correct reception of the signal by comparator 510. Thus the signal can be attenuated "on the fly", before being provided to amplifier 506, such that the overall amplification factor is reduced. This is for example controlled by a sensor which detects the input voltage level.

VGA 506 provides some variable gain based on the level of the input signal, and is controlled based on a feedback signal, for example provided by block 222 in FIG. 2, which determines if the valid data is a "1" bit coming from D1. Thus, some of the dynamic range of the output of the amplifier stage is provided by VGA 506, and the remaining part by the selection of one of the three outputs from comparators 510, 514 and 516, in a similar fashion as described above. Thus, for example, if an amplifying range of 100 dB is required for coping with variations in the input signal, VGA 506 could provide a variable amplification of 0-40 decibels, whilst fixed amplifiers 508 and 512 could provide 30 dB of amplification each, providing the total possible range of 100 decibels. This is advantageous over a circuit comprising only a VGA with 100 dB range as such an amplifier is difficult to implement, consumes high power, and responds relatively slowly to input voltage changes.

An advantage of receiving circuitry described herein is that the amplification of the input signal can be adjusted instantaneously, from one bit to the next. Furthermore, the circuitry is energy efficient when compared to circuitry based on a single VGA. This makes it particularly suitable for applications with limited power, for example for use in devices which are deployed in a battery powered environment and required to be active for a number of years.

The embodiments described herein can be incorporated in a wide range of devices, including portable electronic devices such as mobile telephones, wireless burglar alarms, vehicles communication systems, etc.

Having thus described at least one illustrative embodiment of the invention, various alterations, modifications and improvements will readily occur to those skilled in the art.

For example, while in the above examples particular coding schemes for "0" and "1" data bits have been provided, in alternative embodiments, different encoding can be used. Furthermore, the alternative criteria can be used for selecting the best signal, which, for example, will depend on the coding scheme used for the data.

It will be apparent that while examples of three amplifiers in series have been provided, in alternative embodiments, only two series coupled amplifiers could be provided, or more than three amplifiers. The higher the number of amplifiers, the more finely tuned the amplification factor can be to the particular input voltage level.

The digital components of the circuitry that have been disclosed in a hardware form could be implemented as software controlled components.

Such alterations, modifications and improvements are intended to be within the scope of the invention. Accordingly, the foregoing description is by way of example only and is not intended to be limiting. The invention is limited only as defined in the following claims and the equivalent thereto.

What is claimed is:

1. Receiving circuitry comprising:
   a plurality of amplifiers coupled in series, a first of said amplifiers receiving an input signal and each of said amplifiers outputting an amplified signal;
   a plurality of comparators each coupled to an output of one of said amplifiers and comprising an input for receiving said amplified signal;
   signal identification circuitry coupled to the outputs of said comparators and arranged to determine whether the outputs of said comparators validly represent data; and
   signal selection circuitry arranged to select the best signal originating from said comparators based on the validity of the outputs of said comparators.

2. The receiving circuitry of claim 1, wherein the outputs of the comparators are ranked according to the amplification of the amplified signal at their inputs, the comparator receiving the most amplified signal being given the highest rank, wherein said best signal is determined as the highest ranking valid signal.

3. The receiving circuitry of claim 1, wherein said signal identification circuitry comprises sampling circuitry arranged to sample the outputs of said comparators and to compare said samples with registered values in order to determine whether said outputs of said comparators represent valid data.

4. The receiving circuitry of claim 1, wherein each of said comparators comprises a low threshold value and a high threshold value, said high threshold value being used to detect when a high output from said comparator is provided, and said low threshold being used to determine when a low output from said comparator is provided.

5. The receiving circuitry of claim 1, wherein said plurality of amplifiers are fixed gain amplifiers, and further comprising a variable gain amplifier connected in series with said fixed gain amplifiers.

6. The receiving circuitry of claim 1, further comprising an attenuator selectively coupled to said first of said amplifiers for selectively attenuating said input signal.

7. A portable device comprising the receiving circuitry of claim 1 coupled to a processor.

8. The receiving circuitry of claim 1, wherein each of the plurality of amplifiers amplifies an input signal by a common amount.

9. A method of receiving a data signal comprising:
   amplifying the data signal by a plurality of different amplification factors to generate a plurality of amplified signals;
   comparing said plurality of amplified signals with at least one threshold value to generate a plurality of output signals;
   determining whether each of said plurality of output signals validly represents data; and
   selecting the best signal of said output signals based on the validity of said output signals.

10. The method of claim 9, further comprising determining said best signal as the highest ranking valid output signal from said comparing said plurality of amplified signals with at least one threshold value to generate a plurality of output signals, wherein said ranking is determined based on the amplification of an amplified signal from said amplifying the data signal by a plurality of different amplification factors to generate a plurality of amplified signals.

11. The method of claim 9, wherein determining whether said output signals represent valid data comprises sampling said output signals and comparing said samples with values corresponding to valid data in order to determine whether said output signals of said comparing said plurality of amplified signals with at least one threshold value to generate a plurality of output signals represent valid data.

12. Receiving circuitry comprising:
   a plurality of amplifiers coupled in series, a first of said amplifiers receiving an input signal and each of said amplifiers outputting an amplified signal;
   a plurality of comparators each coupled to an output of one of said amplifiers and comprising an input for receiving said amplified signal;
   signal identification circuitry coupled to the outputs of said comparators and arranged to determine whether the outputs of said comparators validly represent data; and
   signal selection circuitry arranged to select one of the signals originating from said comparators based on the validity of the outputs of said comparators.

13. The receiving circuitry of claim 12, wherein the outputs of the comparators are ranked according to the amplification of the amplified signal at their inputs, the comparator receiving the most amplified signal being given the highest rank, wherein said best signal is determined as the highest ranking valid signal.

14. The receiving circuitry of claim 12, wherein said signal identification circuitry comprises sampling circuitry arranged to sample the outputs of said comparators and to compare said samples with registered values in order to determine whether said outputs of said comparators represent valid data.

15. The receiving circuitry of claim 12, wherein each of said comparators comprises a low threshold value and a high threshold value, said high threshold value being used to detect when a high output from said comparator is provided, and said low threshold being used to determine when a low output from said comparator is provided.

16. The receiving circuitry of claim 15, wherein the low threshold value is a constant value and the high threshold value is a constant value.

17. The receiving circuitry of claim 15, wherein the low threshold value and that the high threshold value are each variable.

18. The receiving circuitry of claim 15, wherein a resistor bank including transistors provides a variable resistance value for the low threshold value and wherein a second bank of resistors and transistors provides the high threshold value.

19. The receiving circuitry of claim 12, wherein said plurality of amplifiers are fixed gain amplifiers, and further comprising a variable gain amplifier connected in series with said fixed gain amplifiers.

20. The receiving circuitry of claim 12, further comprising an attenuator selectively coupled to said first of said amplifiers for selectively attenuating said input signal.

21. A portable device comprising the receiving circuitry of claim 12 coupled to a processor.

* * * * *